US008341495B2

(12) United States Patent
Tan et al.

(10) Patent No.: US 8,341,495 B2
(45) Date of Patent: Dec. 25, 2012

(54) METHOD FOR DETECTING SHORT BURST ERRORS IN LDPC SYSTEM

(75) Inventors: Weijun Tan, Longmont, CO (US);
Shaohua Yang, Santa Clara, CA (US);
Hongwei Song, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/469,746

(22) Filed: May 11, 2012

(65) Prior Publication Data
US 2012/0226958 A1 Sep. 6, 2012

Related U.S. Application Data

(62) Division of application No. 12/287,959, filed on Oct. 15, 2008, now Pat. No. 8,201,051.

(51) Int. Cl.
*H03M 13/00* (2006.01)
*H03M 13/03* (2006.01)
(52) U.S. Cl. .............................. 714/762; 714/788
(58) Field of Classification Search .................. None
See application file for complete search history.

(56) References Cited

U.S. PATENT DOCUMENTS

| | | | |
|---|---|---|---|
| 5,278,846 A | 1/1994 | Okayama et al. | |
| 5,682,114 A | 10/1997 | Ohta | |
| 6,073,250 A | 6/2000 | Luby et al. | |
| 6,631,494 B2 * | 10/2003 | Patapoutian | 714/788 |
| 7,020,829 B2 | 3/2006 | Eroz et al. | |
| 7,263,631 B2 | 8/2007 | Van Buren | |
| 7,646,829 B2 | 1/2010 | Ashley et al. | |
| 2006/0168493 A1 | 7/2006 | Song | |

OTHER PUBLICATIONS

Masato, Yabe, et al., "A DeCoding Algorithm for LDPC Codes Using Threshold Control for the Burst Error Channel", IEICE Technical Report, May 2005, pp. 49-52, vol. 105, No. 84 (T2005 13-21), Published in US.
Mustafa N. Kaynak, et al., "Burst Error Identification for Turbo-and LDPC-Coded Magnetic Recording Systems", IEEE Transactions on Magnetics, Jul. 2004, pp. 3087-3089, vol. 40, No. 4, Published in US.

* cited by examiner

*Primary Examiner* — Phung M Chung
(74) *Attorney, Agent, or Firm* — Suiter Swantz pc llo

(57) ABSTRACT

The present invention is a device for detecting short burst errors. The device includes a first signal input, wherein the first signal input is configured to receive a first signal. The device includes a second signal input, wherein the second signal input is configured to receive a second signal. The device includes a logic gate, wherein the logic gate is operable for receiving the first signal via the first signal input, receiving the second signal via the second signal input, and generating a logic output gate signal based on the received first signal and the second signal. Furthermore, the device includes a filter, wherein the filter is configured for receiving the logic output gate signal from the logic gate and generates a filter output signal based upon the received logic output gate signal, wherein the filter output signal is operable for flagging errors.

4 Claims, 4 Drawing Sheets

METHOD FOR DETECTING SHORT BURST ERRORS IN LDPC SYSTEM

CROSS-REFERENCE TO RELATED APPLICATIONS

The present application claims priority under 35 U.S.C. 120 to U.S. patent application Ser. No. 12/287,959, filed Oct. 15, 2008, pending. U.S. patent application Ser. No. 12/287,959 is hereby incorporated by reference in its entirety. The present application is also related to U.S. patent application Ser. No. 12/114,462 filed May 2, 2008 entitled: Systems and Methods for Queue Based Data Detection and Decoding, filed May 6, 2008, pending, and is hereby incorporated by reference in its entirety.

FIELD OF THE INVENTION

The present invention is related to systems and methods for detecting burst errors, and more particularly to systems and methods for performing iterative codec based short burst error detection in an iterative decoding system.

BACKGROUND OF THE INVENTION

Data read from a disk is susceptible to errors caused by media defects and thermal asperities which may result in burst errors. As data is moved between the storage media and the auxiliary storage device, the data is transmitted over a read channel. Media defects and thermal asperities are transient electrical events, usually associated with a particle, and normally resulting in misreading data in a portion of a sector. Absent accurate detection of these errors the effectiveness of data transmission is reduced. A burst error is a number of errors adjacent to each other. Burst errors happen relatively frequently in the transmission of data and are defined as long or short burst. Long burst errors are easy to detect because of the existence of strong signatures. However, short burst errors are hard to detect because of lack of signatures. This difficulty in detection of short burst errors is common to all coding practices. For example, the failure to detect the short burst errors in using low-density parity-checking encoders and decoders may result in these errors being magnified at the output of the detector. A 100 bit thermal asperity error may propagate to produce a more then 200 bit error at the output of the detector.

Accordingly, there is a need for a mechanism to detect the short burst errors and reduce the adverse affects of short burst errors which can result in poor performance of auxiliary storage devices, such as hard disk drives.

SUMMARY OF THE INVENTION

The present inventions are related to an apparatus for detecting short based errors in a low-density parity-checking (LDPC) system.

Some embodiments of the present invention provide a short burst error detector device. Such devices include a first signal input, a second signal input, a logic gate, and a filter. The first signal input is configured to receive a first signal. The second signal input is configured to receive a second signal. The logic gate is operable for receiving the first signal via the first signal input and receiving the second signal via the second signal input. The logic gate is further operable for generating a logic output gate signal based on the received first signal and the second signal. The filter is configured for receiving the logic output gate signal from the logic gate and generating a filter output signal based upon the received logic output gate signal, wherein the filter output signal is operable for flagging errors.

A further embodiment of the present invention is directed to a method for detecting short burst errors, the method including the steps of receiving a signal, wherein the signal includes a soft input (La) and a soft output (Le); checking the signal for sign disagreement, wherein checking for sign disagreement includes checking the soft input sign(La) and the soft output sign(Le) for disagreement; generating a sign disagreement, wherein a generated disagreement sign is sign (La)≠sign(Le) where the soft output sign(Le) fails to converge with the soft input sign(La); passing the disagreement sign(La)≠sign(Le) through a filter, wherein the filter is a moving average filter configured for generating an averaged sign disagreement; setting a burst threshold for the moving average window; flagging erasures when the burst threshold is exceeded, and extending the erasure edges, wherein the erasure edges are extended left and right of the burst threshold by a maximum number of bits until a zero in the averaged sign is found.

An additional embodiment of the present invention is directed to a system including a receiver; a means for detecting short burst errors in a low-density parity-check (LDPC) code decoder; and a signal processor configured for correcting burst errors.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
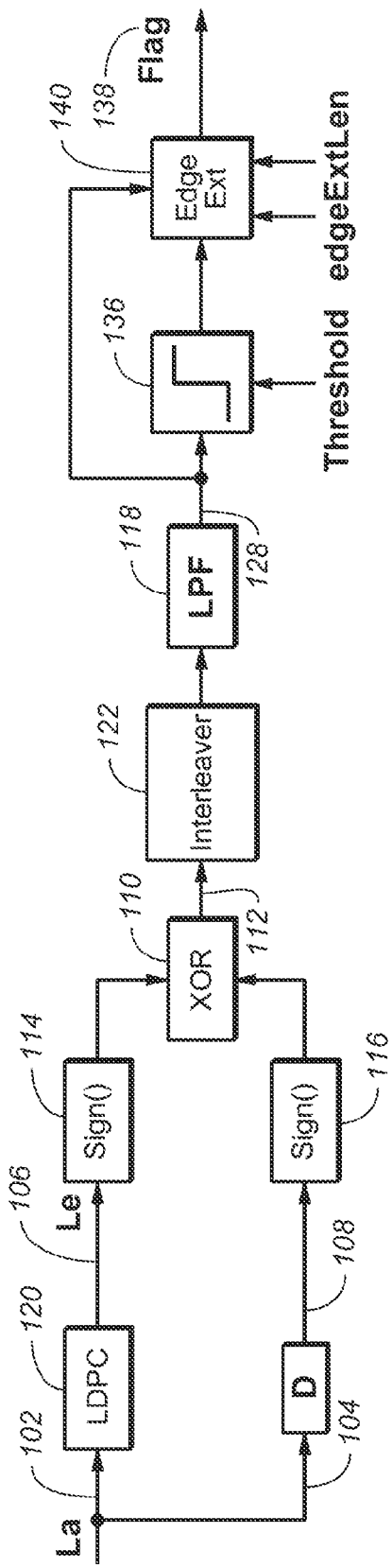
FIG. 1 is a block diagram illustrating a device for detecting short burst errors positioned on the output side of a low-density parity-check (LDPC) code decoder.

Reference will now be made in detail to the presently preferred embodiments of the invention, examples of which are illustrated in the accompanying drawings.

Referring generally to FIGS. 1-5, a short burst error detection device in accordance with an exemplary embodiment of the present invention is shown. The device 100 may include a first signal input 102. The first signal input 102 may be configured to receive a first signal 106. Further, the first signal 106 may be a soft output (Le). Further, the first signal 106 may be provided to the first signal input 102 via a channel detector 218 or a low-density parity-checking (LDPC) code decoder 120.

In current embodiments of the present invention, the device 100 may include a second signal input 104. The second signal input 104 may be configured for receiving a second signal 108. The second signal 108 may be subject to a delay before being received by the second signal input 104. Further, the second signal 108 may be a soft input (La). Further, the second signal 108 may be provided to the second signal input 104 via an input data buffer 434.

In further embodiments of the present invention, the device 100 may include a logic gate 110. The logic gate 110 may be operable for receiving the first signal 106 via the first signal input 102 and for receiving the second signal 108 via the second signal input 104. Further, the logic gate 110 may be an exclusive OR equivalent (XOR) gate. Further, the logic gate 110 may be configured for checking the sign disagreement of the soft output (Le) 106 and the soft input (La) 108. The logic gate 100 may be further configured for generating a logic output gate signal 112. For example, the logic output gate signal 112 may be a disagreement sign (La)≠(Le) 112.

In current embodiments of the present invention, the device 100 may include a filter 118. The filter 118 may be configured for receiving the logic output gate signal 112 from the logic gate 110. Further, the filter 118 may be configured for generating a filter output signal 128. For example, the first signal input 102 may be configured for receiving a first aspect of a signal. The first aspect of the signal may be a soft output (Le) 106. The second signal input 104 may be configured for receiving a second aspect of the signal. The second aspect of the signal may be a soft input (La) 108. The logic gate 110 may be operable for receiving the soft output (Le) 106 from the first signal input 102, and the soft input (La) 108 from the second signal input 104. The logic gate 110 may be an exclusive OR equivalent (XOR) gate configured for checking the sign disagreement between the soft output (Le) 106 and the soft input (La) 108. The logic gate 110 may be configured for generating a logic output gate signal 112 based on the sign disagreement of the soft output (Le) 108 and the soft input (La) 108. For example, the logic output gate signal 112 may be a sign(Le)≠sign(La) 112. Further, the device may include a filter 118. For example, the filter 118 may be a moving average window. The filter 118 is configured for receiving the logic output gate signal 112 from the logic gate 110 and generating a filter output signal 128 based on the received logic output gate signal 112. Further, the filter 118 may be configured for setting a burst threshold 136. For example, a burst threshold 136 may be configured for providing an adjustable burst threshold level. Where the burst threshold is exceeded an erasure flag 138 is generated and an edge extension is performed. For example, a first edge 140 is extended to the left and a second edge 142 is extended to the right of the erasure flag 138.

In a first aspect of the present invention the first signal 106 may be provided to the logic gate 110 via a low-density parity-check (LDPC) code decoder 120. Further, the device 100 may be positioned on the output side of the LDPC code decoder (not shown). In this described placement of the device 100 a sign disagreement interleaver 122 may be included as part of the device 100 when an interleaver is used on the soft output (Le) 108.

Figure 2:
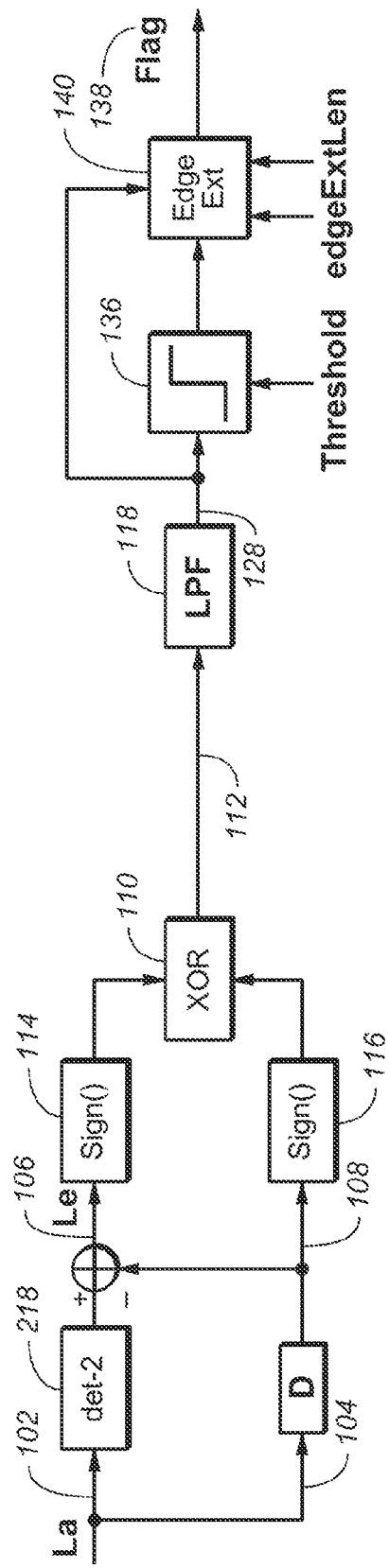
FIG. 2 is a block diagram illustrating a device for detecting short burst errors positioned on the output side of a channel detector.

In a second aspect, the first signal 106 may be provided to the logic gate 110 via a channel detector 218. Further, the device 100 may be positioned on the output side of the channel detector 218 as illustrated in FIG. 2.

Figure 3:
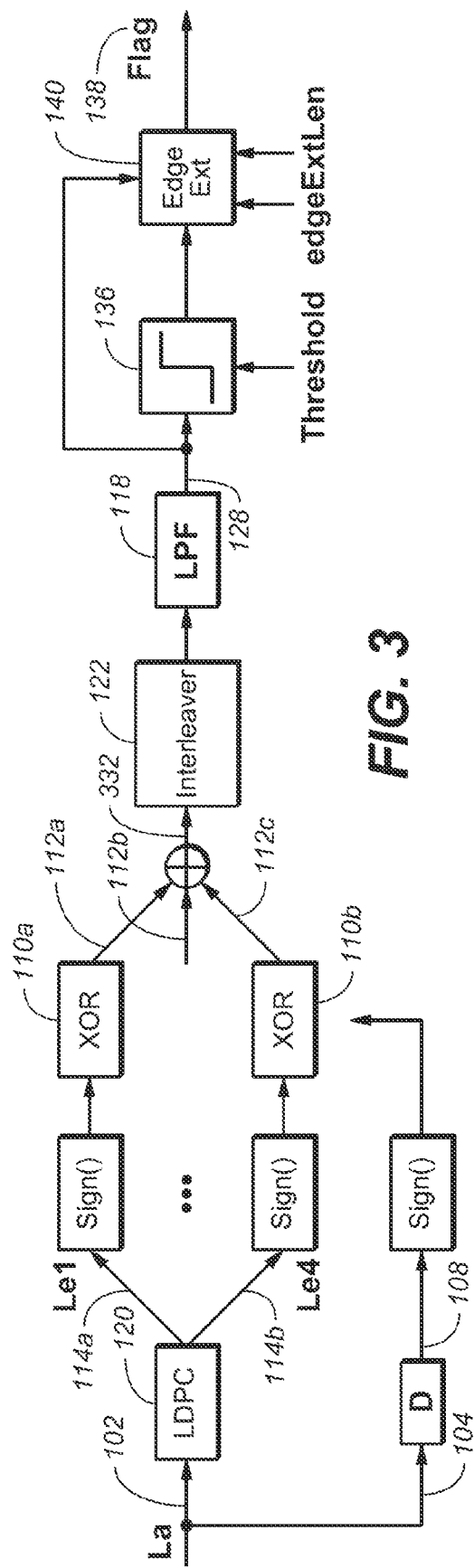
FIG. 3 is a block diagram illustrating a device for detecting short burst errors positioned on the output side of a low-density parity-check (LDPC) code decoder using a interleaver on the soft output (Le)
Figure 4:
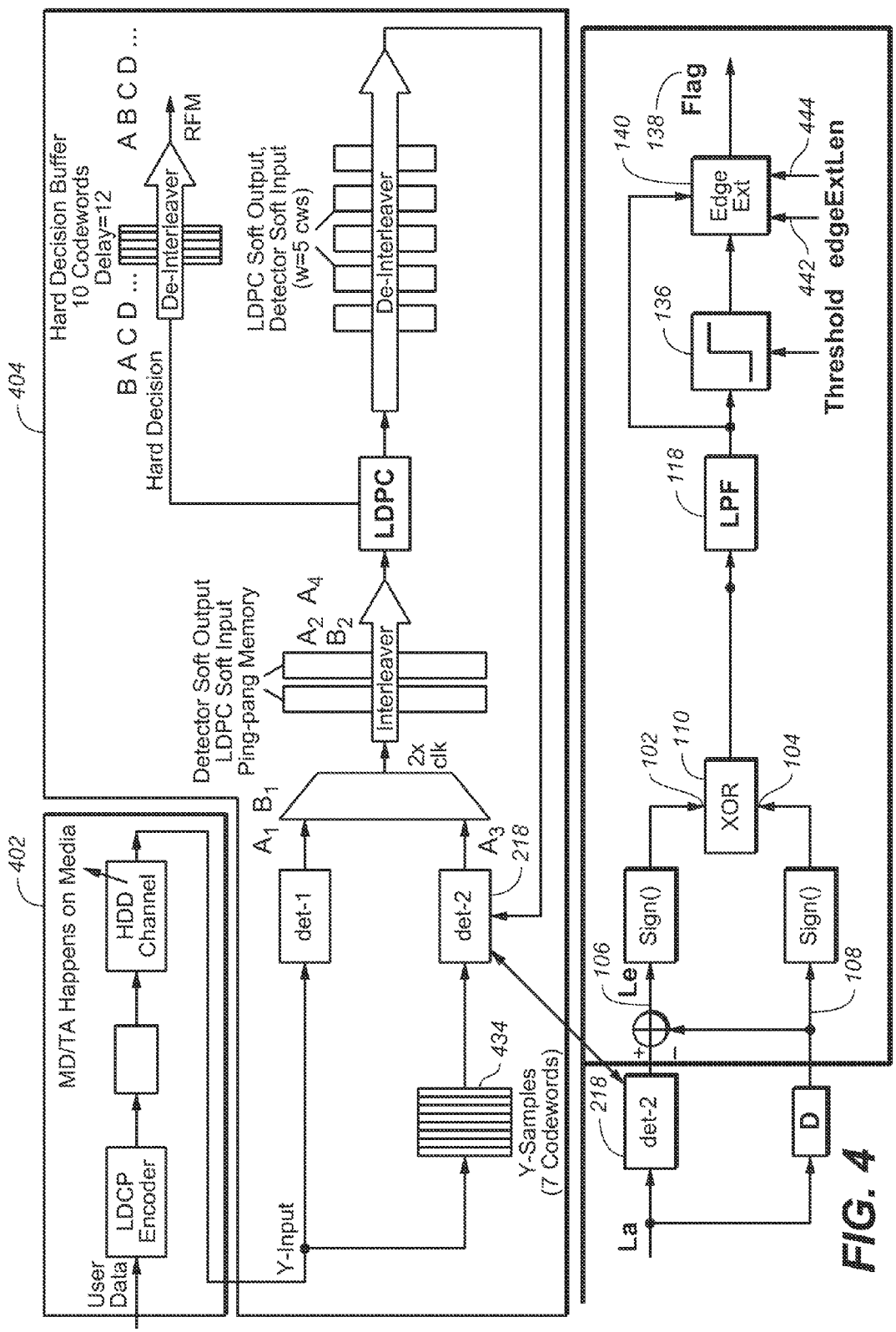
FIG. 4 is a system diagram illustrating a device for detecting short burst errors in a LDPC system positioned on the output side of a channel detector.

In a further embodiment as illustrated in FIG. 3, a short burst error detection device in accordance with an exemplary embodiment of the present invention is shown. The device 100 illustrates a short burst error detection device located on the output side of a low-density parity-check (LDPC) code decoder 120. The device 100 may include a interleaver on the output side of the LDPC code decoder (not shown), wherein the soft output (Le) 106 is interleaved to a plurality of components. For example, the plurality of components may be (Le1) 106a . . . (Le4) 106d. Further, the device 100 may include a plurality of logic gate 110. For example, a plurality of logic gate 110 may include logic gate 110 . . . logic gate 110b. Further, the device 100 may generate a plurality of logic output gate signal 112. For example, a plurality of logic gate output signal 112 may include logic output gate signal 112a, 112b, and 112c. Further, the device 100 may include a sum generated output signal 332 resulting from logic output gate signal 112a, 112b, and 112c. Further, the device may include a sign disagreement interleaver 122 configured for receiving the sum generated output signal 332.

In a further embodiment of the present invention an interleaver may be used on the soft output (Le) 108. For example, an interleaved soft output (Le) 108 may be shown as Le1+Le2+Le3+Le4=Le. For example, the device may receive a soft output (Le1) 106a . . . and a soft output (Le4) 106d. Further, where a plurality of soft output (Le) . . . soft output (Le4) 106d is provided the device may include a plurality of logic gate 110. For example, the device may include logic gate 110, and logic gate 110b. Where the device includes logic gate 110 and logic Gate 110b the logic gate output signal 112a, 112b, and 112c from each will be become the basis for a sum generated output signal disagreement sign(La)≠sign (Le) 332.

Further, the second signal 108 may be provided to the logic gate 110 via an input data buffer 434. Further, the device may include a filter 118 configured for receiving the sum generated disagreement sign(La)≠sign(Le) 132 and creating a moving average. Further, the device 100 is configured for setting a burst threshold 136, generating an erasure 138 in the moving average window 114, and extending a first edge and a second edge of the erasure 138 by a maximum number of bits until a good bit is found. For example, where a zero in an averaged sign is found to the left and the right the extension stops.

Figure 5:
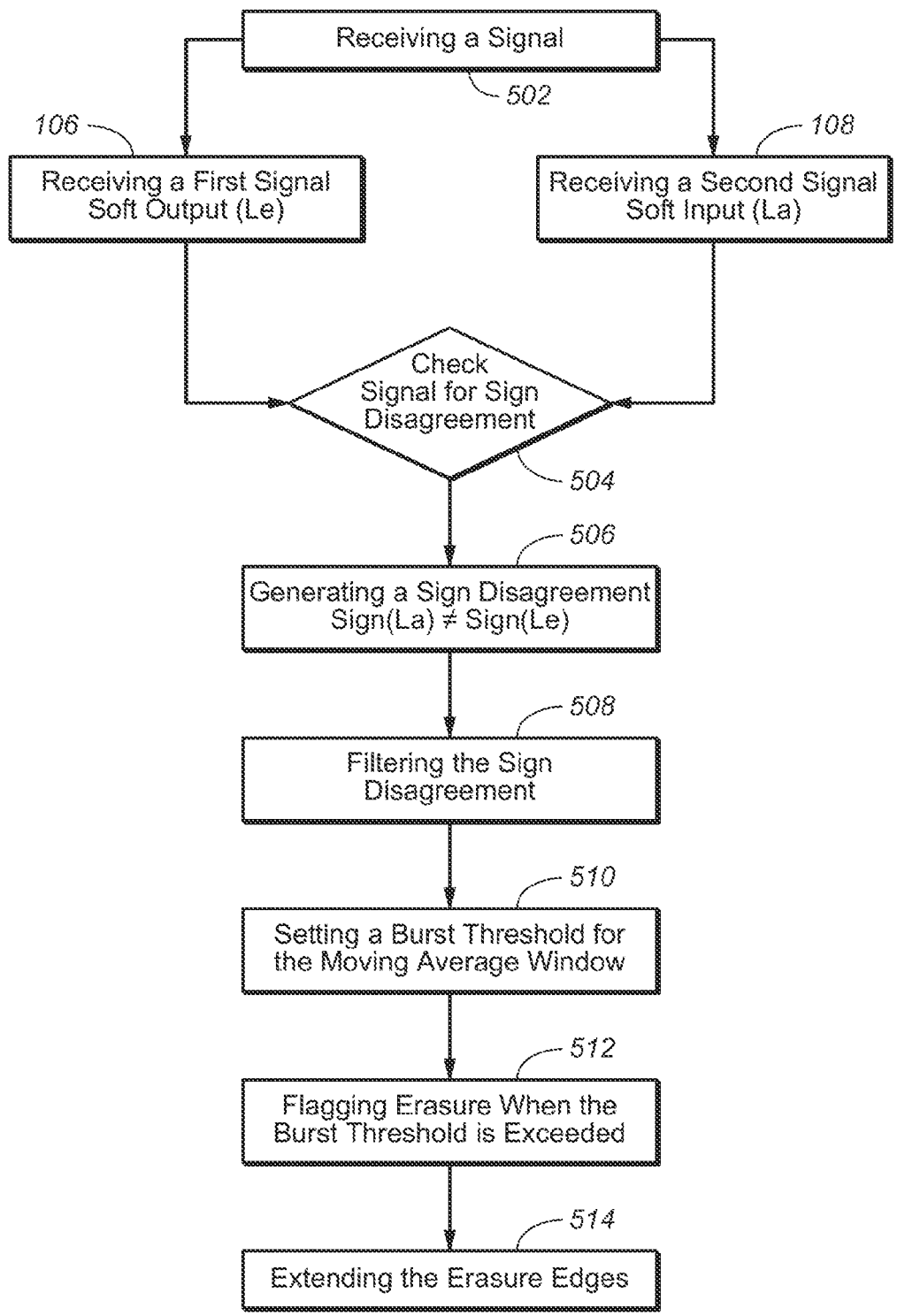
FIG. 5 is a flowchart illustrating a method of detecting short burst errors using low-density parity-check (LDPC) code parity violations.

Referring generally to FIG. 5 is a flowchart illustrating a method 500 for detecting short burst errors in accordance with an exemplary embodiment of the present invention. The method 500 may include the step of receiving a signal 502 wherein the signal 202 may include a soft input (La)108 and a soft output (Le)106. Further, method 500 may include the step of checking the signal for sign disagreement 504. For example, checking the signal for sign disagreement 504 is a comparison of the sign (La)108 and the sign(Le) 106. Further, where the sign(La) 108 fails to converge with sign(Le) 106, method 500 includes the step of generating a sign disagreement sign(La)≠sign(Le) 506. Further, method 500 includes passing the sign disagreement sign(La)≠sign(Le) through a filter 508. Further, method 500 may include the step of setting a burst threshold 510 for the moving average window 118 and flagging erasures 512 on the moving average window 118 when the threshold is exceeded. Further, the method 500 may include the step of extending the erasure edges 514 by a maximum number of bits to the left and right until a zero in the averaged sign is found.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for detecting short burst errors, the method comprising:
    receiving a signal, wherein the signal includes a soft input (La) and a soft output (Le), wherein receiving a signal is through at least one of a channel detector or a low-density parity-check (LDPC) code decoder to detect short burst errors;
    checking the signal for sign disagreement, wherein checking for sign disagreement includes checking a soft input sign(La) and a soft output sign(Le) for disagreement;
    generating a sign disagreement, wherein a generated disagreement sign is sign(La)≠sign(Le) where the soft output sign(Le) fails to converge with the soft input sign (La);
    passing the sign disagreement (La)≠(Le) through a filter, wherein the filter is a moving average filter which includes a moving average window configured for generating an averaged sign;
    setting a burst threshold for the moving average window;
    generating an erasure flag when the burst threshold is exceeded; and
    extending erasure edges, wherein the erasure edges are extended left and right of the burst threshold by a maximum number of bits until a zero in the averaged sign is found.

2. The method of claim 1, further comprising:
    interleaving the disagreement sign(La)≠sign(Le).

3. A system, comprising:
    a receiver;
    a detector, the detector in communication with the receiver, the detector configured to detect short burst errors in a low-density parity-check (LDPC) code decoder; and
    a signal processor configured for correcting burst errors, wherein the detector is configured to:
    receive a signal, wherein the signal includes a soft input (La) and a soft output (Le);
    check the signal for sign disagreement including to check a soft input sign(La) and a soft output sign(Le) for disagreement;
    generate a sign disagreement, wherein a generated disagreement sign is sign(La)≠sign(Le) where the soft output sign(Le) fails to converge with the soft input sign (La);
    pass the sign disagreement (La)≠(Le) through a filter, wherein the filter is a moving average filter which includes a moving average window configured to generate an averaged sign;
    set a burst threshold for the moving average window;
    generate an erasure flag when the burst threshold is exceeded; and
    extend erasure edges, wherein the erasure edges are extended left and right of the burst threshold by a maximum number of bits until a zero in the averaged sign is found.

4. The system of claim 3, further comprising:
    an interleaver for interleaving the disagreement sign(La)≠sign(Le).

* * * * *